United States Patent
Li et al.

(10) Patent No.: US 11,615,922 B2
(45) Date of Patent: Mar. 28, 2023

(54) CAPACITIVE ELEMENT AND PLASMA PROCESSING DEVICE

(71) Applicant: NISSIN ELECTRIC CO., LTD., Kyoto (JP)

(72) Inventors: Dongwei Li, Kyoto (JP); Yasunori Ando, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 197 days.

(21) Appl. No.: 16/964,603

(22) PCT Filed: Jan. 25, 2019

(86) PCT No.: PCT/JP2019/002497
§ 371 (c)(1),
(2) Date: Jul. 24, 2020

(87) PCT Pub. No.: WO2019/146758
PCT Pub. Date: Aug. 1, 2019

(65) Prior Publication Data
US 2021/0050156 A1  Feb. 18, 2021

(30) Foreign Application Priority Data

Jan. 25, 2018  (JP) .............................. JP2018-010961

(51) Int. Cl.
*H01J 37/32* (2006.01)
*H01G 5/013* (2006.01)
*H01G 5/12* (2006.01)

(52) U.S. Cl.
CPC ............. *H01G 5/0132* (2013.01); *H01G 5/12* (2013.01); *H01J 37/321* (2013.01);
(Continued)

(58) Field of Classification Search
CPC ........ H01G 5/0132; H01G 5/12; H01G 5/014; H01G 5/013; H01G 5/06; H01G 5/08;
(Continued)

(56) References Cited

U.S. PATENT DOCUMENTS 6,174,408 B1 * 1/2001 Kadomura ........ H01L 21/32137
118/724
6,966,225 B1 * 11/2005 Mallary ................ G01P 15/125
73/514.32
(Continued)

FOREIGN PATENT DOCUMENTS

| CN | 1392754 | 1/2003 |
| CN | 1812684 | 8/2006 |

(Continued)

OTHER PUBLICATIONS

"Office Action of China Counterpart Application", dated Jun. 3, 2021, with English translation thereof, p. 1-p. 15.
(Continued)

*Primary Examiner* — Seokjin Kim
(74) *Attorney, Agent, or Firm* — JCIPRNET (57) ABSTRACT

A capacitive element using a liquid as a dielectric, whereby the capacitance is prevented from changing. The capacitive element is equipped with: a storage container that has an inlet port for introducing a liquid serving as a dielectric, has an outlet port for discharging the liquid, and is filled with the liquid; and at least one pair of electrodes that are provided in the storage container and face each other, wherein an opening section for exhausting air bubbles in the storage container is formed in an upper wall of the storage container.

8 Claims, 10 Drawing Sheets

(52) U.S. Cl.
CPC .... *H01J 37/3244* (2013.01); *H01J 37/32174* (2013.01); *H01J 2237/002* (2013.01)

(58) Field of Classification Search
CPC ............... H01J 37/321; H01J 37/32174; H01J 37/3244; H01J 2237/002; H05H 1/46; H05H 1/4645
See application file for complete search history.

(56) References Cited

U.S. PATENT DOCUMENTS

| | | | | |
|---|---|---|---|---|
| 2002/0020189 | A1* | 2/2002 | Namose | H01J 37/32724 62/434 |
| 2002/0189763 | A1* | 12/2002 | Kwon | H01J 37/32174 156/345.48 |
| 2003/0090853 | A1* | 5/2003 | Johnson | H01G 5/0132 361/277 |
| 2009/0080138 | A1* | 3/2009 | Lohndorf | H01G 5/40 361/292 |
| 2010/0126666 | A1 | 5/2010 | Tandou et al. | |
| 2013/0220829 | A1* | 8/2013 | Rigby | C02F 1/46104 205/744 |
| 2014/0069783 | A1* | 3/2014 | Rofougaran | H01G 5/0132 200/233 |
| 2016/0099130 | A1* | 4/2016 | Ando | H01J 37/32522 315/111.21 |

FOREIGN PATENT DOCUMENTS

| | | |
|---|---|---|
| CN | 206489987 | 9/2017 |
| JP | S51137639 | 11/1976 |
| JP | H0232515 | 2/1990 |
| JP | 2009272354 | 11/2009 |
| JP | 2013134836 | 7/2013 |
| JP | 2013152788 | 8/2013 |
| JP | 2017063000 | 3/2017 |
| JP | 6561725 | 8/2019 |
| KR | 20160039558 | 4/2016 |
| KR | 101762904 | 7/2017 |

OTHER PUBLICATIONS

"International Search Report (Form PCT/ISA/210) of PCT/JP2019/002497," dated Apr. 16, 2019, with English translation thereof, pp. 1-4.

Soloviet, "On the basis of wireline telecommunications measurement techniques," Translated by Chengdu Institute of Telecommunication Engineering, People's Posts & Telecommunications Press, Beijing, Jan. 1960, pp. 57-60, with English translation thereof.

"Office Action of China Counterpart Application" with English translation thereof, dated Dec. 9, 2021, p. 1-p. 14.

"Office Action of Korea Counterpart Application" with English translation thereof, dated Feb. 14, 2022, p. 1-p. 9.

* cited by examiner

CAPACITIVE ELEMENT AND PLASMA PROCESSING DEVICE

CROSS-REFERENCE TO RELATED APPLICATION

This application is a 371 application of an international PCT application serial no. PCT/JP2019/002497, filed on Jan. 25, 2019, which claims the priority benefit of Japan Patent Application No. 2018-010961, filed on Jan. 25, 2018. The entirety of each of the above-mentioned patent applications is hereby incorporated by reference herein and made a part of this specification.

TECHNICAL FIELD

The present invention relates to a capacitive element and a plasma processing device including the capacitive element.

BACKGROUND ART

As a capacitive element, as shown in Patent Literature 1, there is a capacitive element which includes a pair of electrodes and a dielectric interposed between these electrodes and uses a liquid as the dielectric.

However, when the liquid is used as the dielectric, there is a case in which air bubbles flow into a container constituting the capacitive element or air bubbles are generated inside the container and such air bubbles are caught in a vortex generated in the container and do not escape from the container. Then, air bubbles adhere to the electrodes and a capacitance changes. As a result, a problem arises in that reliability is impaired.

CITATION LIST

Patent Literature

[Patent Literature 1]
Japanese Patent Laid-Open No. 2009-272354

SUMMARY OF INVENTION

Technical Problem

Here, the present invention has been made to solve the above-described problems and a main object thereof is to prevent a change in capacitance in a capacitive element using a liquid as a dielectric.

Solution to Problem

That is, a capacitive element according to the present invention includes: a storage container which is provided with an inlet port for introducing a liquid serving as a dielectric and an outlet port for discharging the liquid and is filled with the liquid; and at least a pair of electrodes which are provided inside the storage container and face each other, wherein an upper wall of the storage container is provided with an opening section exhausting air bubbles in the storage container.

According to such a capacitive element, since the upper wall of the storage container is provided with the opening section exhausting air bubbles, air bubbles flowing into the storage container or air bubbles generated inside the storage container can be exhausted from the opening section and hence a change in capacitance can be prevented.

The opening section may be formed inside an outer peripheral portion of the upper wall, and an inner surface of the upper wall may be provided with a bubble guide portion which is inclined upward as it goes from the outer peripheral portion of the upper wall toward the opening section and guides air bubbles to the opening section.

According to this configuration, since air bubbles floating inside the storage container are guided to the opening section by the bubble guide portion, air bubbles can be more reliably exhausted.

The bubble guide portion may be a flat surface or a curved surface.

According to this configuration, the bubble guide portion does not have a step and air bubbles can be guided to the opening section without stagnation.

Incidentally, in a configuration in which the inlet port is formed in a side wall of the storage container and one of the pair of electrodes includes a flange member that is fixed to the side wall and is provided with a through-hole communicating with the inlet port and an electrode plate which is supported by the flange member, when a step is formed between the inlet port and the through-hole, a vortex is easily generated at the step portion and air bubbles tend to stagnate at a corner portion.

Here, in order to prevent the stagnation of air bubbles in the above-described configuration, the inlet port and at least a part of the through-hole may communicate with each other without a step therebetween.

A pipe member may be connected to the opening section and the pipe member may be connected to a downstream side of the storage container.

According to this configuration, since the opening section communicates with a negative pressure area on the downstream side of the storage container, air bubbles can be exhausted from the opening section along with a liquid.

A valve may be provided in the opening section or a flow path connecting the opening section and a downstream side of the storage container.

According to this configuration, for example, when an opening and closing valve is used as the valve, air bubbles in the storage container can be exhausted by appropriately opening the opening and closing valve if necessary. Then, when a pressure reduction valve is used as the valve, air bubbles can be automatically exhausted by opening the pressure reduction valve when a pressure inside the storage container becomes a predetermined value or more, for example, even when air bubbles are generated inside the storage container while the flow of the liquid is stopped.

As a detailed embodiment of the capacitive element, one of the pair of electrodes is a fixed electrode, the other of the pair of electrodes is a movable electrode movable with respect to the fixed electrode, and its capacitance is variable.

Further, a plasma processing device according to the present invention includes: the capacitive element; and an antenna conductor which is electrically connected to the capacitive element and through which a high-frequency current flows to generate plasma.

In such a configuration, it is possible to provide the plasma processing device that exhibits the operations and effects obtained by the capacitive element, that is, the operations and effects in which a change in this capacitance is prevented while a liquid is used as the dielectric of the capacitive element.

The antenna conductor may include a flow path through which a cooling liquid flows and the liquid serving as the dielectric of the capacitive element may be formed by at least the cooling liquid.

In such a configuration, since the dielectric of the capacitive element is configured by at least the cooling liquid of the antenna conductor, an unexpected change in capacitance can be suppressed while cooling the capacitive element.

Further, when the cooling liquid is adjusted to a constant temperature by a temperature adjustment mechanism, it is possible to suppress a change in relative dielectric constant due to a temperature change by using the cooling liquid as the dielectric and thus to suppress a change in capacitance caused by the change in relative dielectric constant.

Furthermore, when water is used as the cooling liquid, a relative dielectric constant of water is about 80 at 20° C. and hence the capacitive element capable of withstanding a high voltage can be configured.

Advantageous Effects of Invention

According to the present invention with such a configuration, it is possible to prevent a change in capacitance in a capacitive element using a liquid as a dielectric.

DESCRIPTION OF EMBODIMENTS

Hereinafter, an embodiment of a plasma processing device according to the present invention will be described with reference to the drawings.

<Device Configuration>

A plasma processing device 100 of the embodiment processes a substrate W using an inductively coupled plasma P. Here, the substrate W is, for example, a substrate for a flat panel display (FPD) such as a liquid crystal display or an organic EL display, a flexible substrate for a flexible display, or the like. Further, the processing performed on the substrate W is, for example, film forming by plasma CVD, etching, ashing, sputtering, or the like.

Additionally, the plasma processing device 100 is also called a plasma CVD device when performing film forming by a plasma CVD method, a plasma etching device when performing etching, a plasma ashing device when performing ashing, or a plasma sputtering device when performing sputtering.

Figure 1:
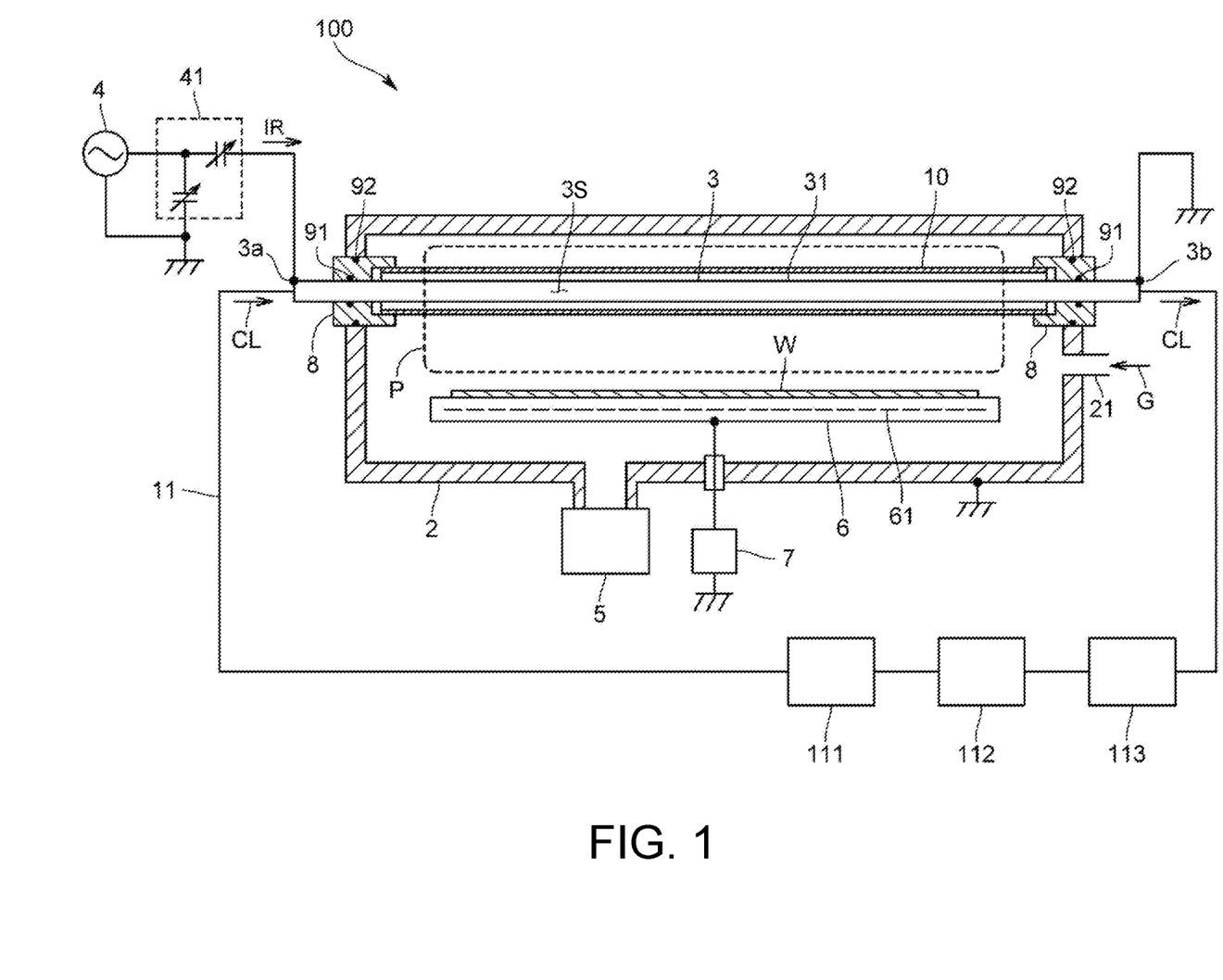
FIG. 1 is a longitudinal cross-sectional view schematically showing a configuration of a plasma processing device of an embodiment.
Figure 2:
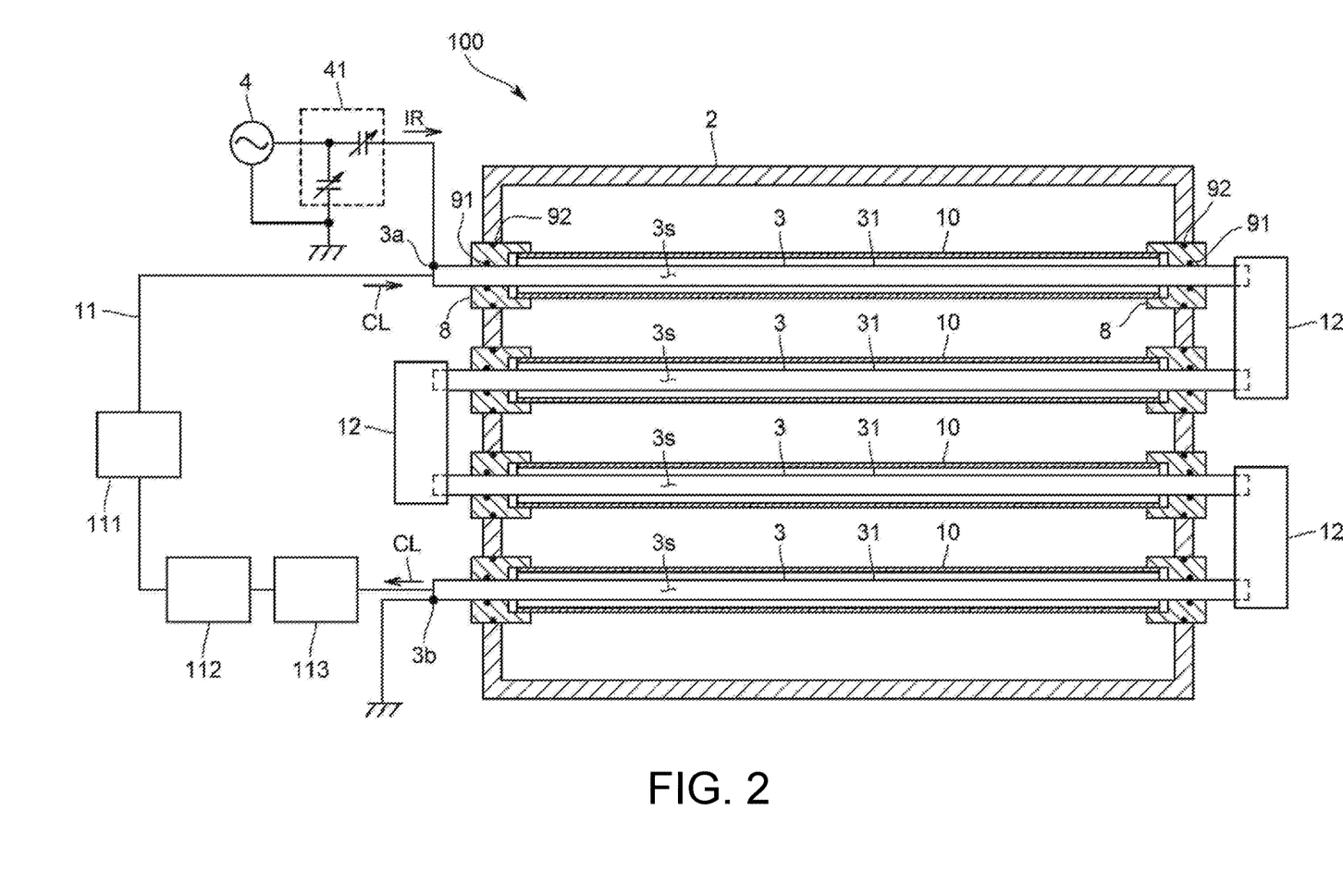
FIG. 2 is a cross-sectional view schematically showing a configuration of the plasma processing device of the embodiment.

Specifically, the plasma processing device 100 includes, as shown in FIGS. 1 and 2, a vacuum container 2 which is evacuated and into which a gas G is introduced, a straight antenna conductor 3 which is disposed inside the vacuum container 2, and a high-frequency power supply 4 which applies a high frequency for generating the inductively coupled plasma P inside the vacuum container 2 to the antenna conductor 3. Additionally, when a high frequency is applied from the high-frequency power supply 4 to the antenna conductor 3, a high-frequency current IR flows through the antenna conductor 3 and an induction electric field is generated in the vacuum container 2 to generate the inductively coupled plasma P.

The vacuum container 2 is, for example, a metallic container and the inside thereof is evacuated by a vacuum evacuation device 5. In this example, the vacuum container 2 is electrically grounded.

The gas G is introduced into the vacuum container 2 via, for example, a flow regulator (not shown) and a plurality of gas inlets 21 arranged in a direction along the antenna conductor 3. The gas G may be selected according to the processing content applied to the substrate W.

Further, a substrate holder 6 which holds the substrate W is provided inside the vacuum container 2. As in this example, a bias voltage may be applied from a bias power supply 7 to the substrate holder 6. The bias voltage is, for example, a negative DC voltage, a negative bias voltage, or the like, but is not limited thereto. With such a bias voltage, for example, the energy when positive ions in the plasma P enter the substrate W can be controlled and the crystallinity of the film formed on the surface of the substrate W can be controlled. A heater 61 which heats the substrate W may be provided inside the substrate holder 6.

A plurality of the antenna conductors 3 is arranged above the substrate W inside the vacuum container 2 so as to follow the surface of the substrate W (for example, substantially in parallel to the surface of the substrate W).

The vicinity of both end portions of the antenna conductor 3 respectively penetrates the facing side walls of the vacuum container 2. Insulating members 8 are respectively provided in the portions penetrating both end portions of the antenna conductor 3 to the outside of the vacuum container 2. Both end portions of the antenna conductor 3 penetrate these respective insulating members 8 and the penetration portion is sealed in a vacuum state, for example, by a packing 91. A gap between each insulating member 8 and the vacuum container 2 is also sealed in a vacuum state, for example, by a packing 92. Additionally, the material of the insulating member 8 is, for example, ceramics such as alumina, quartz, or engineering plastics such as polyphenylene sulfide (PPS) and polyether ether ketone (PEEK).

Further, a portion located inside the vacuum container 2 in the antenna conductor 3 is covered by a straight tubular insulating cover 10. Both end portions of the insulating cover 10 are supported by the insulating member 8. Additionally, the material of the insulating cover 10 is, for example, quartz, alumina, fluororesin, silicon nitride, silicon carbide, silicon, or the like.

Then, the plurality of antenna conductors 3 has a hollow structure with a flow path 3S through which a cooling liquid CL flows. In this embodiment, the antenna conductor is a metallic pipe having a straight tubular shape. The material of a metallic pipe 31 is, for example, copper, aluminum, alloys of these, stainless steel, or the like.

Additionally, the cooling liquid CL flows through the antenna conductor 3 by a circulation flow path 11 provided outside the vacuum container 2 and the circulation flow path 11 is provided with a temperature adjustment mechanism 111 such as a heat exchanger for adjusting the cooling liquid CL to a constant temperature and a circulation mechanism 112 such as a pump for circulating the cooling liquid CL in the circulation flow path 11. From the viewpoint of electrical insulation, the cooling liquid CL is preferably high resistance water, for example, pure water or water close thereto. In addition, a liquid refrigerant other than water such as a fluorine-based inert liquid may be used.

Further, the plurality of antenna conductors 3 is connected to each other by a connection conductor 12 into one antenna structure as shown in FIG. 2. That is, the end portions extending toward the outside of the vacuum container 2 in the adjacent antenna conductors 3 are electrically connected to each other by the connection conductor 12. Specifically, in the adjacent antenna conductors 3, the end portion of one antenna conductor 3 and the end portion of the other antenna conductor 3 are electrically connected to each other by the connection conductor 12.

Here, the end portions of two antenna conductors 3 connected to each other by the connection conductor 12 are the end portions located on the same side wall side. Accordingly, the plurality of antenna conductors 3 is configured such that high-frequency currents in opposite directions flow to the antenna conductors 3 adjacent to each other.

Then, the connection conductor 12 has a flow path therein and the cooling liquid CL flows through the flow path. Specifically, one end portion of the connection conductor 12 communicates with the flow path of one antenna conductor 3 and the other end portion of the connection conductor 12 communicates with the flow path of the other antenna conductor 3. Accordingly, the cooling liquid CL flowing through one antenna conductor 3 in the adjacent antenna conductors 3 flows to the other antenna conductor 3 through the flow path of the connection conductor 12. Accordingly, the plurality of antenna conductors 3 can be cooled by the common cooling liquid CL. Further, since the plurality of antenna conductors 3 can be cooled by one flow path, the configuration of the circulation flow path 11 can be simplified.

In the plurality of antenna conductors 3, one end portion not connected by the connection conductor 12 serves as a power supply end portion 3a and the high-frequency power supply 4 is connected to the power supply end portion 3a via a matching circuit 41. Further, a terminal end portion 3b which is the other end portion is directly grounded. Additionally, the terminal end portion 3b may be grounded via a capacitor, a coil, or the like.

With the above-described configuration, the high-frequency current IR can flow from the high-frequency power supply 4 to the antenna conductor 3 via the matching circuit 41. The high frequency is generally, for example, 13.56 MHz, but is not limited thereto.

<Configuration of Connection Conductor 12>

Next, the connection conductor 12 will be described in detail with reference to FIGS. 3 to 7. Additionally, a description of a seal member or the like of a part of FIGS. 3 and 4 and the like is omitted.

Figure 3:
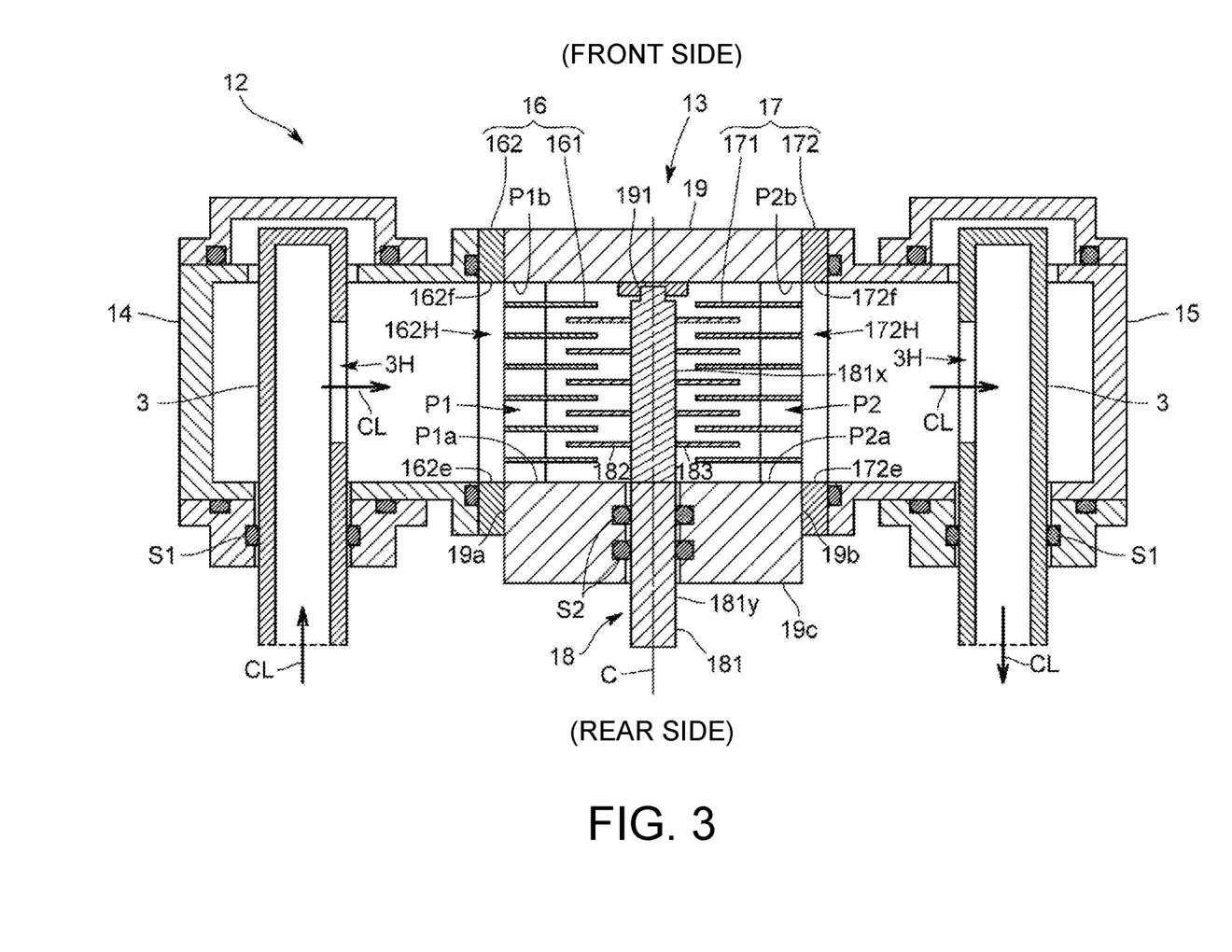
FIG. 3 is a cross-sectional view schematically showing a variable capacitor of the embodiment.
Figure 4:
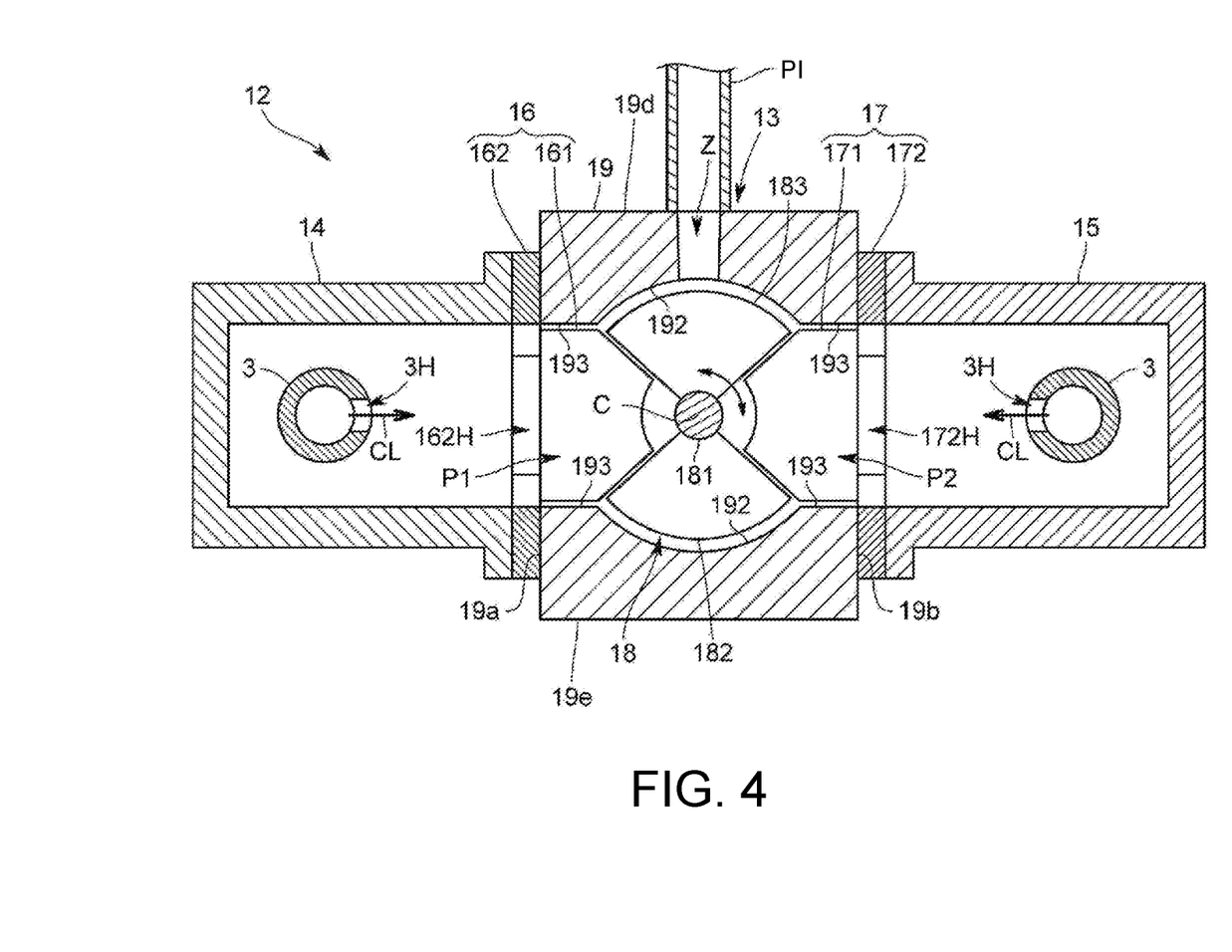
FIG. 4 is a longitudinal cross-sectional view schematically showing the variable capacitor of the embodiment.

The connection conductor 12 includes, as shown in FIGS. 3 and 4, a variable capacitor 13 which is a capacitive element electrically connected to the antenna conductor 3, a first connection part 14 which connects the variable capacitor 13 and the end portion of one antenna conductor 3, and a second connection part 15 which connects the variable capacitor 13 and the end portion of the other antenna conductor 3.

The first connection part 14 and the second connection part 15 surround the end portion of the antenna conductor 3 to be electrically connected to the antenna conductor 3 and lead the cooling liquid CL from an opening section 3H formed at the end portion of the antenna conductor 3 to the variable capacitor 13. The materials of the connection parts 14 and 15 are, for example, copper, aluminum, alloys of these, stainless steel, or the like.

Each of the connection parts 14 and 15 of the embodiment is liquid-tightly attached to the end portion of the antenna conductor 3 via a seal member S1 such as an O-ring on the side of the vacuum container 2 in relation to the opening section 3H and the outside of the opening section 3H is not constrained (see FIG. 3). Accordingly, a slight inclination of the antenna conductor 3 with respect to the connection parts 14 and 15 is allowed.

The variable capacitor 13 includes a first fixed electrode 16 which is electrically connected to one antenna conductor 3, a second fixed electrode 17 which is electrically connected to the other antenna conductor 3, and a movable electrode 18 which forms a first capacitor between the movable electrode and the first fixed electrode 16 and forms a second capacitor between the movable electrode and the second fixed electrode 17.

The variable capacitor 13 of the embodiment is configured to change the capacitance in such a manner that the movable electrode 18 rotates around a predetermined rotation shaft C. Then, the variable capacitor 13 includes a storage container 19 having an insulation property and storing the first fixed electrode 16, the second fixed electrode 17, and the movable electrode 18.

The storage container 19 includes an inlet port P1 which introduces the cooling liquid CL from one antenna conductor 3 and an outlet port P2 which discharges the cooling liquid CL to the other antenna conductor 3. The inlet port P1 is formed in one side wall of the storage container 19 (in FIG. 3, a left side wall 19a), the outlet port P2 is formed in the other side wall of the storage container 19 (in FIG. 3, a right side wall 19b), and the inlet port P1 and the outlet port P2 are provided at the facing positions. Additionally, the storage container 19 of the embodiment has a substantially rectangular parallelepiped shape having a hollow portion therein, but may have another shape.

The first fixed electrode 16 and the second fixed electrode 17 are provided at different positions around the rotation shaft C of the movable electrode 18. In this embodiment, the first fixed electrode 16 is provided so as to be inserted from the inlet port P1 of the storage container 19 into the storage container 19. Further, the second fixed electrode 17 is provided so as to be inserted from the outlet port P2 of the storage container 19 into the storage container 19. Accordingly, the first fixed electrode 16 and the second fixed electrode 17 are provided at symmetrical positions with respect to the rotation shaft C.

The first fixed electrode 16 includes a plurality of first fixed metal plates 161 which is provided so as to face each other. Further, the second fixed electrode 17 includes a plurality of second fixed metal plates 171 which is provided so as to face each other. The fixed metal plates 161 and 171 are respectively provided at substantially the same intervals along the rotation shaft C.

Then, the plurality of first fixed metal plates 161 has the same shape and are supported by a first flange member 162.

The first flange member 162 is fixed to the left side wall 19a provided with the inlet port P1 of the storage container 19. Here, the first flange member 162 is provided with a through-hole 162H which communicates with the inlet port P1 (see FIG. 5). The through-hole 162H has a substantially rectangular shape in a plan view. Here, the upper surface and the lower surface of the inner peripheral surface forming the through-hole 162H have a comb tooth shape. That is, a convex portion 162a protruding downward and a concave portion 162b depressed upward are alternately formed in the upper surface and the upper end portion of the first fixed metal plate 161 is supported by each convex portion 162a. Further, a convex portion 162c protruding upward and a concave portion 162d depressed downward are alternately formed in the lower surface and the lower end portion of the first fixed metal plate 161 is supported by each convex portion 162c.

The plurality of second fixed metal plates 171 has the same shape and is supported by a second flange member 172. The second flange member 172 is fixed to the right side wall 19b provided with the outlet port P2 of the storage container 19. Here, the second flange member 172 is provided with a through-hole 172H communicating with the outlet port P2. Here, the through-hole 172H has the same shape as that of the through-hole 162H and has a substantially rectangular shape in a plan view and the upper surface and the lower surface of the inner peripheral surface forming the through-hole 172H are formed in a comb tooth shape. That is, a convex portion protruding downward and a concave portion depressed upward are alternately formed in the upper surface and the upper end portion of the second fixed metal plate 171 is supported by each convex portion. Further, a convex portion protruding upward and a concave portion depressed downward are alternately formed in the lower surface and the lower end portion of the second fixed metal plate 171 is supported by each convex portion.

The plurality of first fixed metal plates 161 and the plurality of second fixed metal plates 171 are provided at the symmetrical positions with respect to the rotation shaft C while being fixed to the storage container 19.

Figure 6:
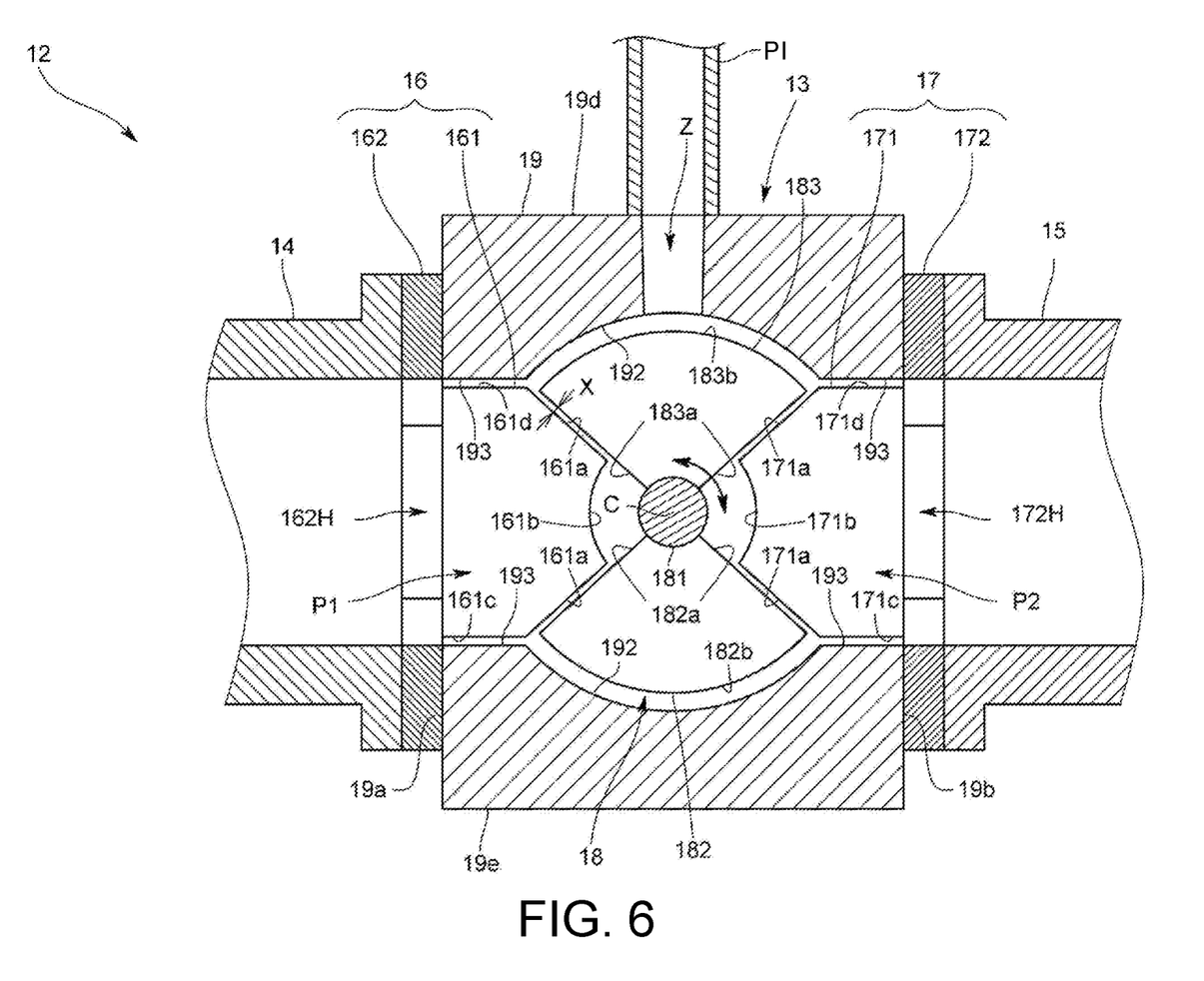
FIG. 6 is a schematic view showing a state in which a fixed metal plate and a movable metal plate of the embodiment do not face each other.

Further, the first fixed metal plate 161 and the second fixed metal plate 171 are formed in a flat plate shape and are formed in a shape in which a width decreases toward the rotation shaft C in a plan view as shown in FIG. 6. Then, in the fixed metal plates 161 and 171, end edges 161a and 171a whose width contracts are formed along the radial direction of the rotation shaft C. Additionally, an angle formed by the facing end edges 161a and 171a is 90°. Further, front end edges 161b and 171b on the side of the rotation shaft C in the fixed metal plates 161 and 171 are formed in an arc shape.

The movable electrode 18 includes, as shown in FIG. 3, a rotation shaft body 181 which is axially supported by the side wall of the storage container 19 (in FIG. 3, a front side wall 19c) so as to be rotatable around the rotation shaft C, a first movable metal plate 182 which is supported by the rotation shaft body 181 and faces the first fixed electrode 16, and a second movable metal plate 183 which is supported by the rotation shaft body 181 and faces the second fixed electrode 17.

The rotation shaft body 181 is formed in a straight shape extending along the rotation shaft C. One end portion of the rotation shaft body 181 is formed so as to extend from the front side wall 19c of the storage container 19 toward the outside. Then, the rotation shaft body 181 is rotatably supported by a seal member S2 such as an O-ring in the front side wall 19c of the storage container 19. Here, the rotation shaft body 181 is supported at two points by two O-rings in the front side wall 19c. Further, the other end portion of the rotation shaft body 181 rotatably contacts a positioning recess 191 formed in the inner surface of the storage container 19.

Further, in the rotation shaft body 181, a portion 181x that supports the first movable metal plate 182 and the second movable metal plate 183 is formed of a conductive material such as metal and a portion 181y that extends from the storage container 19 toward the outside is formed of an insulation material such as resin.

A plurality of the first movable metal plates 182 is provided so as to correspond to the first fixed metal plates 161. Additionally, each of the first movable metal plates 182 has the same shape. Further, a plurality of the second movable metal plates 183 is provided so as to correspond to the second fixed metal plates 171. Additionally, each of the second movable metal plates 183 has the same shape. The movable metal plates 182 and 183 are respectively provided at the substantially same intervals along the rotation shaft C. Further, in this embodiment, the respective movable metal plates 182 and 183 are interposed between the respective fixed metal plates 161 and 171. In FIG. 3, the fixed metal plates 161 and 171 are six plates and the movable metal plates 182 and 183 are five plates, but the present invention is not limited thereto. Additionally, a gap between the movable metal plates 182 and 183 and the fixed metal plates 161 and 171 is, for example, 1 mm.

As shown in FIG. 4, the first movable metal plate 182 and the second movable metal plate 183 are provided at the symmetrical positions with respect to the rotation shaft C and have the same shape. Specifically, as shown in FIG. 6, each of the movable metal plates 182 and 183 has a fan shape that expands radially outward from the rotation shaft C in a plan view. In this embodiment, the movable metal plate is formed in a fan shape having a center angle of 90°.

Figure 7:
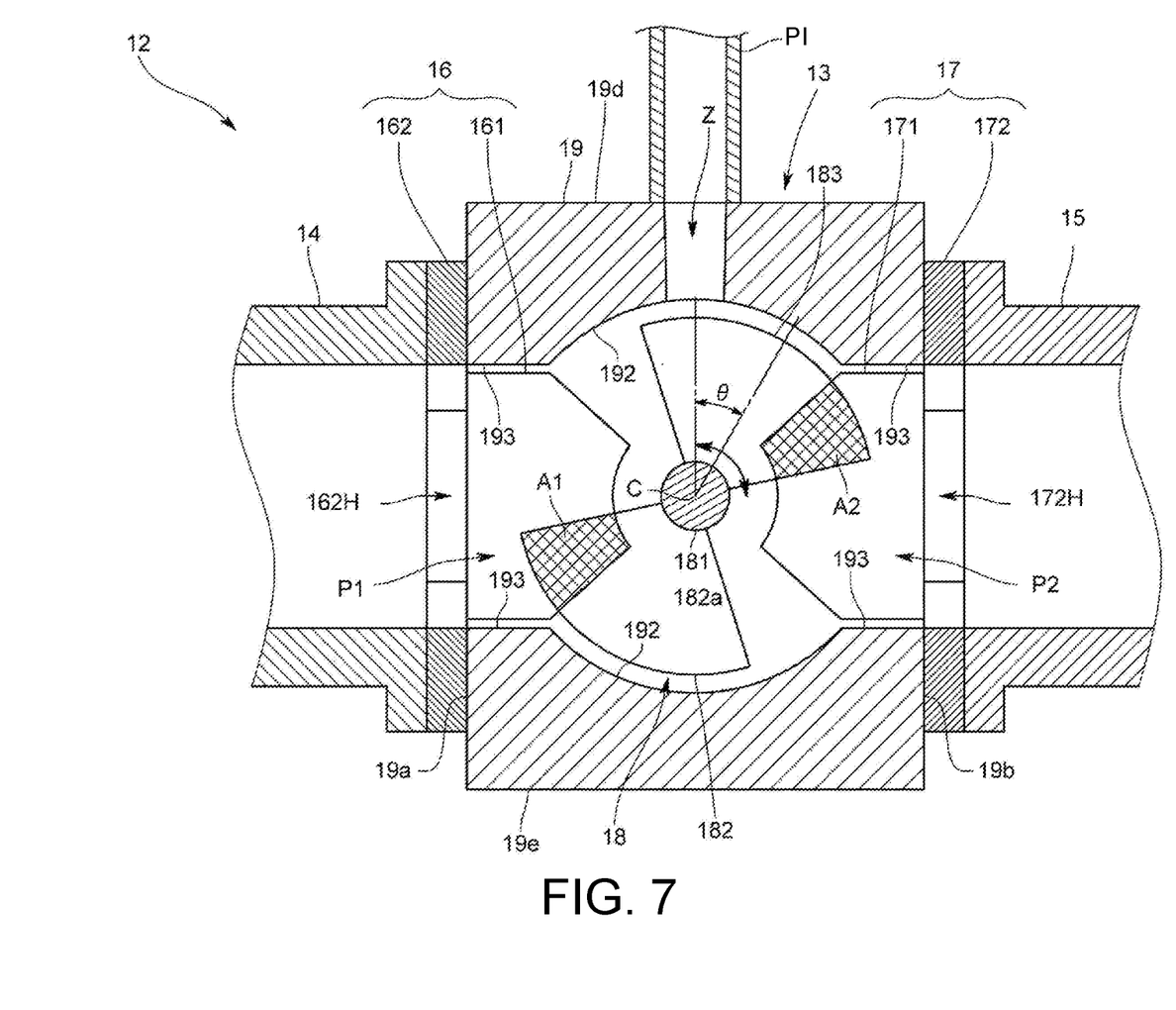
FIG. 7 is a schematic view showing a state in which the fixed metal plate and the movable metal plate of the embodiment face each other.

When the movable electrode 18 is rotated in the variable capacitor 13 with such a configuration, as shown in FIG. 7, a facing area between the first fixed metal plate 161 and the first movable metal plate 182 (a first facing area A1) changes and a facing area between the second fixed metal plate 171 and the second movable metal plate 183 (a second facing area A2) changes. In this embodiment, the first facing area A1 and the second facing area A2 change similarly. Further, the front end edges 161b and 171b on the side of the rotation shaft C in the fixed metal plates 161 and 171 have an arc shape and the movable electrode 18 is rotated so that the first facing area A1 and the second facing area A2 change in proportion to a rotation angle θ of the movable electrode 18.

Further, in this embodiment, as shown in FIG. 6, a gap X is provided between expanding end edges 182a and 183a of the movable metal plates 182 and 183 and reduced end edges 161a and 171a of the fixed metal plates 161 and 171 in a plan view while the respective fixed metal plates 161 and 171 and the respective movable metal plates 182 and 183 do not face each other. Accordingly, the movable electrode 18 can be separated in the axial direction. In this embodiment, the movable electrode 18 is separated when the front side wall 19c supporting the movable electrode 18 is separated along the axial direction.

In the above-described configuration, the inside of the storage container 19 is filled with the cooling liquid CL when the cooling liquid CL flows from the inlet port P1 of the storage container 19. At this time, a gap between the first fixed metal plate 161 and the first movable metal plate 182 is filled with the cooling liquid CL and a gap between the second fixed metal plate 171 and the second movable metal plate 183 is filled with the cooling liquid CL. Accordingly, the cooling liquid CL is the dielectric of the first capacitor and is the dielectric of the second capacitor. In this embodiment, the capacitance of the first capacitor is the same as the capacitance of the second capacitor. Further, the first capacitor and the second capacitor with such a configuration are connected in series to each other and the capacitance of the variable capacitor 13 is a half of the capacitance of the first capacitor (or the second capacitor).

Here, in this embodiment, a direction in which the first fixed electrode 16 and the second fixed electrode 17 face the movable electrode 18 is orthogonal to a direction in which the inlet port P1 faces the outlet port P2. That is, the fixed metal plates 161 and 171 and the movable metal plates 182 and 183 are provided along a direction in which the inlet port P1 faces the outlet port P2. With this configuration, the cooling liquid CL easily flows through the storage container 19. As a result, the replacement of the cooling liquid CL inside the storage container 19 is facilitated and the variable capacitor 13 can be cooled with high efficiency. Further, the cooling liquid CL flowing from the inlet port P1 easily flows into a gap between the fixed metal plates 161 and 171 and the movable metal plates 182 and 183 and easily flows from a gap between the fixed metal plates 161 and 171 and the movable metal plates 182 and 183. As a result, the replacement of the cooling liquid between the fixed metal plates 161 and 171 and the movable metal plates 182 and 183 is facilitated and a temperature change of the cooling liquid CL serving as the dielectric is suppressed. Accordingly, the capacitance of the variable capacitor 13 can be easily maintained constantly. Further, it is difficult for air bubbles to stagnating between the fixed metal plates 161 and 171 and the movable metal plates 182 and 183.

However, in this embodiment, as shown in FIG. 4, an upper wall 19d of the storage container 19 is provided with an opening section Z for exhausting air bubbles in the storage container 19. Specifically, the opening section Z is formed at the inside of the outer peripheral portion of the upper wall 19d, that is, the center portion of the upper wall 19d and is located above the rotation shaft C of the movable electrode 18 here. Additionally, the shape and number of the opening sections Z may be appropriately changed, but here, one substantially circular opening section Z is formed in a plan view.

One end of a pipe member PI is connected to the opening section Z and the other end of the pipe member PI is connected to the downstream side of the storage container 19. More specifically, the other end of the pipe member PI is connected to the upstream side of the circulation mechanism 112 at the outside of the vacuum container 2, so that air bubbles in the storage container 19 are exhausted from the storage container 19 through the opening section Z along with the cooling liquid CL. In this embodiment, as shown in FIGS. 1 and 2, a defoaming device 113 such as a buffer container having an upward opening is provided on the upstream side of the circulation mechanism 112 and the other end of the pipe member PI is connected to the upstream side of the defoaming device 113.

Furthermore, the storage container 19 includes a bubble guide portion 192 which is formed in the inner surface of the upper wall 19d and guides air bubbles to the opening section Z. The bubble guide portion 192 is, for example, a curved surface which is inclined upward as it goes from the outer peripheral portion of the upper wall 19d toward the opening section Z. Here, as shown in FIG. 6, the bubble guide portion 192 is formed in a shape following the outer end edge 183b of the movable electrode 18, that is, an arc shape in a cross-section orthogonal to the rotation shaft C. In this embodiment, the bubble guide portion 192 is formed from the upstream side to the downstream side of the opening section Z so as to straddle the opening section Z, in other words, from the first connection part 14 to the second connection part 15.

The bubble guide portion 192 of the embodiment is provided in a part of a region of the inner surface of the upper wall 19d and a flat portion 193 is provided in the other regions so as to be continuous to the bubble guide portion 192. The flat portion 193 is a flat surface which extends from the bubble guide portion 192 toward the outside and here is formed in a shape along upper edges 161d and 171d of the fixed metal plates 161 and 171 in a cross-section orthogonal to the rotation shaft C as shown in FIG. 6.

The bubble guide portion 192 and the flat portion 193 are also formed in the inner surface of the bottom wall 19e of the storage container 19 and here are respectively provided at the symmetrical positions with respect to the rotation shaft C in the inner surface of the upper wall 19d and the inner surface of the bottom wall 19e. That is, the bubble guide portion 192 provided in the bottom wall 19e is formed in a shape along an outer end edge 182b of the movable electrode 18, that is, an arc shape and the flat portion 193 provided in the bottom wall 19e is formed in a shape along lower edges 161c and 171c of the fixed metal plates 161 and 171.

Furthermore, in this embodiment, as shown in FIGS. 3 to 6, the inlet port P1 formed in the left side wall 19a of the storage container 19 communicates with at least a part of the through-hole 162H formed in the first flange member 162 without a step.

Figure 5:
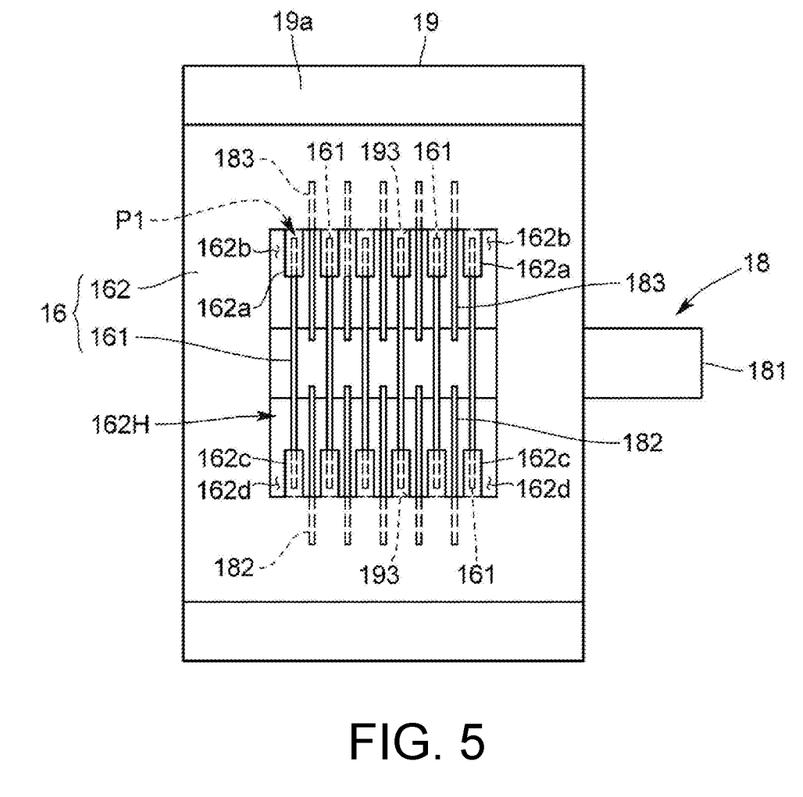
FIG. 5 is a side view in which the variable capacitor of the embodiment is viewed from an inlet port side.

More specifically, as shown in FIG. 5, the convex portions 162a and 162c and the concave portions 162b and 162d are alternately formed in the upper surface and the lower surface of the inner peripheral surface forming the through-hole 162H and the bottom surface of each of the concave portions 162b and 162d among them is flush with the flat portion 193.

Further, in this embodiment, as shown in FIG. 3, a front surface P1a in the inner peripheral surface forming the inlet port P1 is flush with a front surface 162e in the inner peripheral surface forming the through-hole 162H and a rear surface P1b in the inner peripheral surface forming the inlet port P1 is flush with a rear surface 162f in the inner peripheral surface forming the through-hole 162H.

Accordingly, the outer periphery of the inlet port P1 and the outer periphery of the through-hole 162H partially overlap each other.

The same applies to the outlet port P2 formed in the right side wall 19b of the storage container 19 and the outlet port P2 communicates with at least a part of the through-hole 172H formed in the second flange member 172 without a step.

More specifically, a convex portion and a concave portion are alternately formed in the upper surface and the lower surface in the inner peripheral surface forming the through-hole 172H and a bottom surface of each concave portion among them is flush with the flat portion 193.

Further, in this embodiment, as shown in FIG. 3, a front surface P2a in the inner peripheral surface forming the outlet port P2 is flush with a front surface 172e in the inner peripheral surface forming the through-hole 172H and a rear surface P2b in the inner peripheral surface forming the outlet port P2 is flush with a rear surface 172f in the inner peripheral surface forming the through-hole 172H.

Accordingly, the outer periphery of the outlet port P2 and the outer periphery of the through-hole 172H partially overlap each other.

Here, all of the front surfaces P1a, 162e, P2a, and 172e are flush with one another and the front side of the inner wall surface of the storage container 19 is formed in a flat shape without a step from the inlet port P1 to the outlet port P2.

Further, all of the rear surfaces P1b, 162f, P2b, and 172f are flush with one another and the rear side of the inner wall surface of the storage container 19 is formed in a flat shape without a step from the inlet port P1 to the outlet port P2.

Effect of Embodiment

According to the plasma processing device 100 of the embodiment with such a configuration, since the upper wall 19d of the storage container 19 is provided with the opening section Z exhausting air bubbles, air bubbles flowing into the storage container 19 or air bubbles generated inside the storage container 19 can be exhausted from the opening section Z and hence a change in capacitance of the variable capacitor 13 due to air bubbles can be prevented.

Further, since the inner surface of the upper wall 19d of the storage container 19 is provided with the bubble guide portion 192 which guides air bubbles to the opening section Z, air bubbles floating in the storage container 19 are guided to the opening section Z and air bubbles can be more reliably exhausted.

Furthermore, since the inlet port P1 communicates with at least a part of the through-hole 162H without a step and the outlet port P2 communicates with at least a part of the through-hole 172H without a step, it is possible to suppress the vortex or stagnation of the cooling liquid CL inside the storage container 19 and to prevent the stagnation of air bubbles in the storage container 19. Specifically, for example, since the cooling liquid CL directed from the through-hole 162H toward the inlet port P1 is guided to the inlet port P1 while passing through the concave portion 162b of the inner surface forming the through-hole 162H and wrapping around to the rear side of the convex portion 162a, the stagnation of air bubbles in the through-hole 162H or the inlet port P1 is suppressed.

In addition, since the bubble guide portion 192 has a shape along the outer end edges 182b and 183b of the movable electrode 18 and the flat portion 193 has a shape along the upper edges 161d and 171d or the lower edges 161c and 171c of the fixed metal plates 161 and 171, the volume inside the storage container 19 can be made as small as possible. Accordingly, the cooling liquid CL inside the storage container 19 can be promptly replaced and the high cooling efficiency of the variable capacitor 13 can be achieved.

Further, since the antenna conductor 3 can be cooled by the cooling liquid CL, the plasma P can be stably generated. Further, since the dielectric of the variable capacitor 13 is formed by the cooling liquid CL flowing through the antenna conductor 3, it is possible to suppress an unexpected change in capacitance while cooling the variable capacitor 13.

Other Modified Examples

Additionally, the present invention is not limited to the above-described embodiment.

For example, in the above-described embodiment, the upper wall 19d of the storage container 19 is provided with one opening section Z, but may be provided with a plurality of the opening sections Z. As an example of this case, a configuration is exemplified in which the plurality of opening sections Z is formed in a row along the rotation shaft C in the upper wall.

Figure 8:
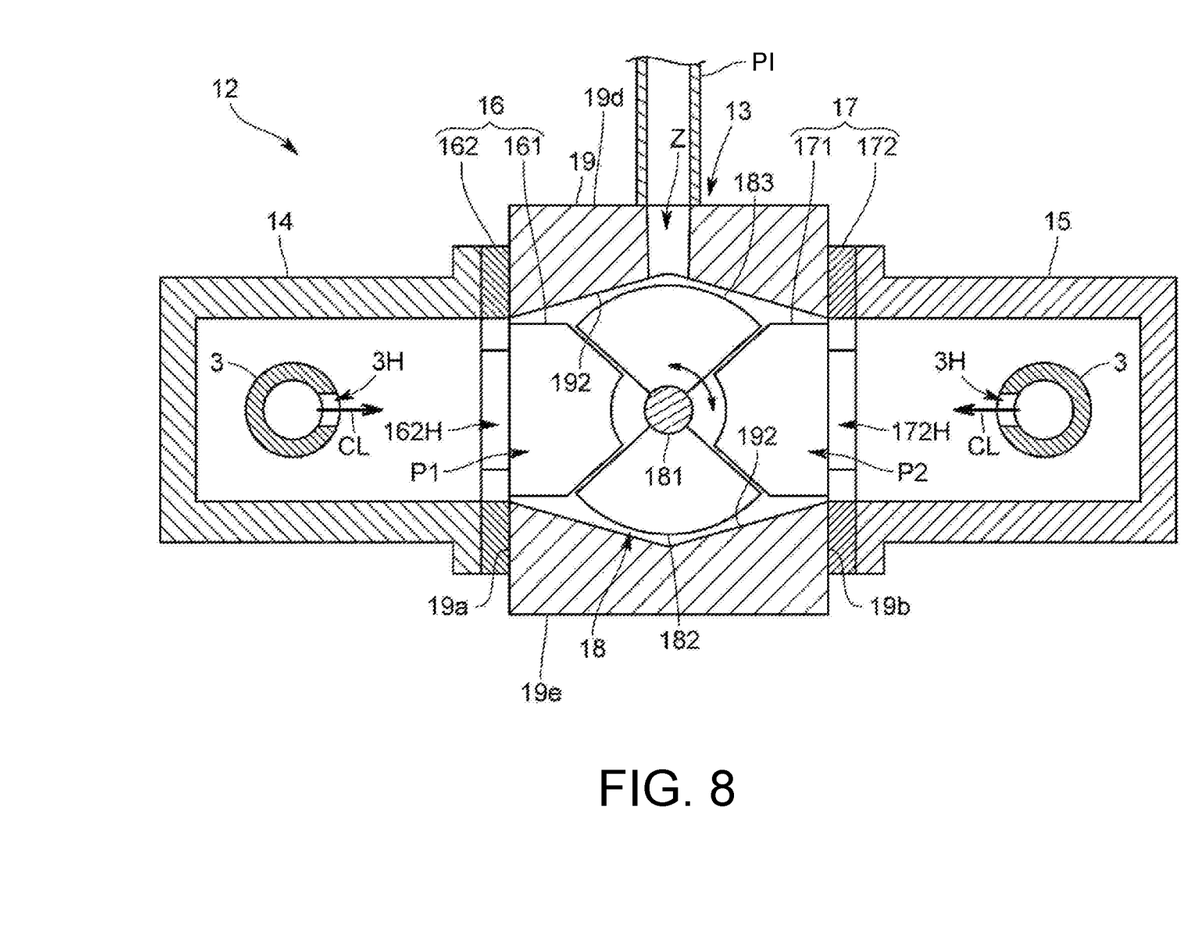
FIG. 8 is a longitudinal cross-sectional view schematically showing a variable capacitor of another embodiment.

In the above-described embodiment, the bubble guide portion 192 is a curved surface, but may be a flat surface inclined toward the opening section Z as shown in FIG. 8.

Further, the flat portion 193 does not need to be essentially provided and as shown in FIG. 8, the bubble guide portion 192 may be provided from the outer end portion of the inner surface of the upper wall 19d to the opening section.

Further, a valve may be provided in the opening section Z or the flow path connecting the opening section Z and the storage container 19.

Figure 9:
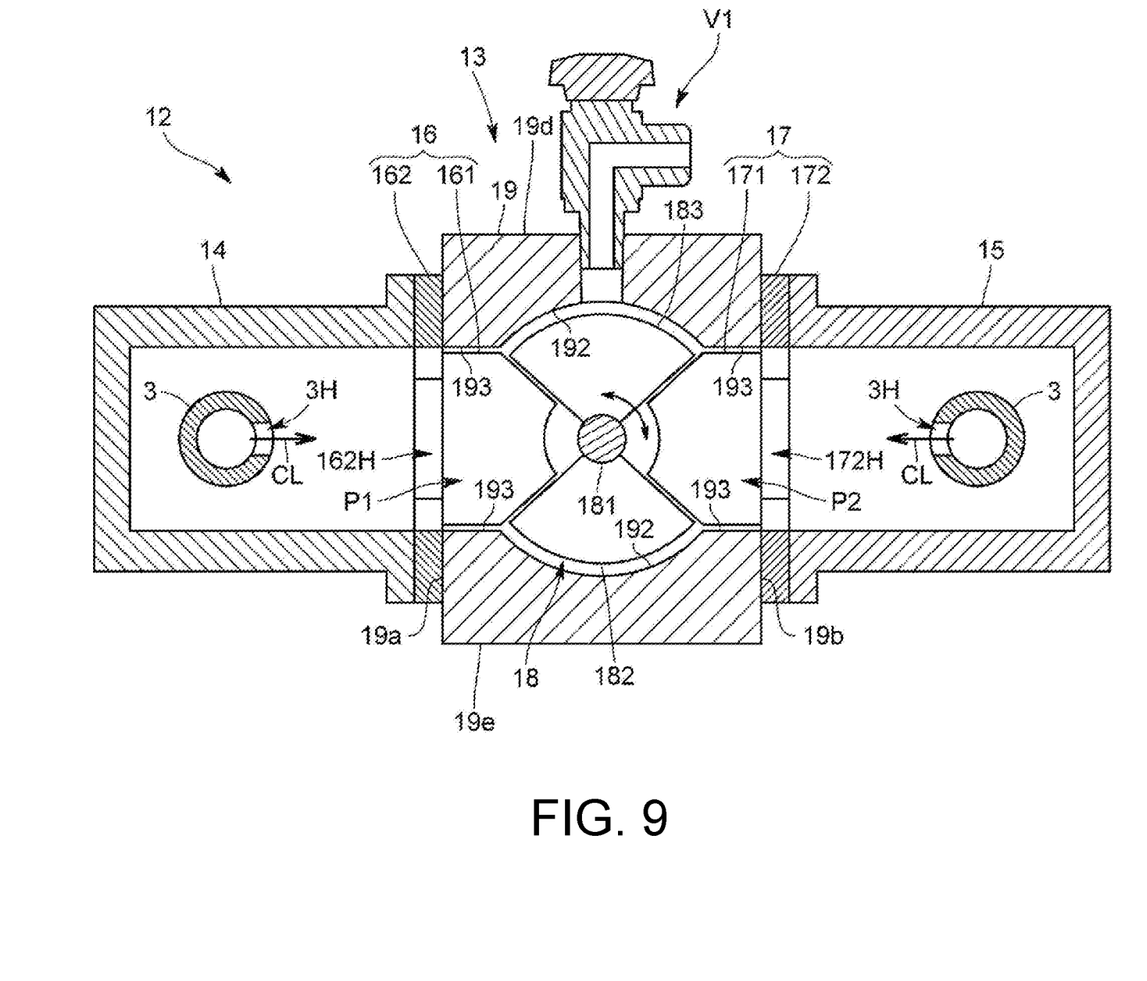
FIG. 9 is a longitudinal cross-sectional view schematically showing the variable capacitor of another embodiment.

As an example, as shown in FIG. 9, a configuration in which the opening section Z is provided with an opening and closing valve V1 automatically or manually opened and closed can be exemplified. In such a configuration, air bubbles in the storage container 19 can be exhausted by appropriately opening the opening and closing valve V1 if necessary.

Figure 10:
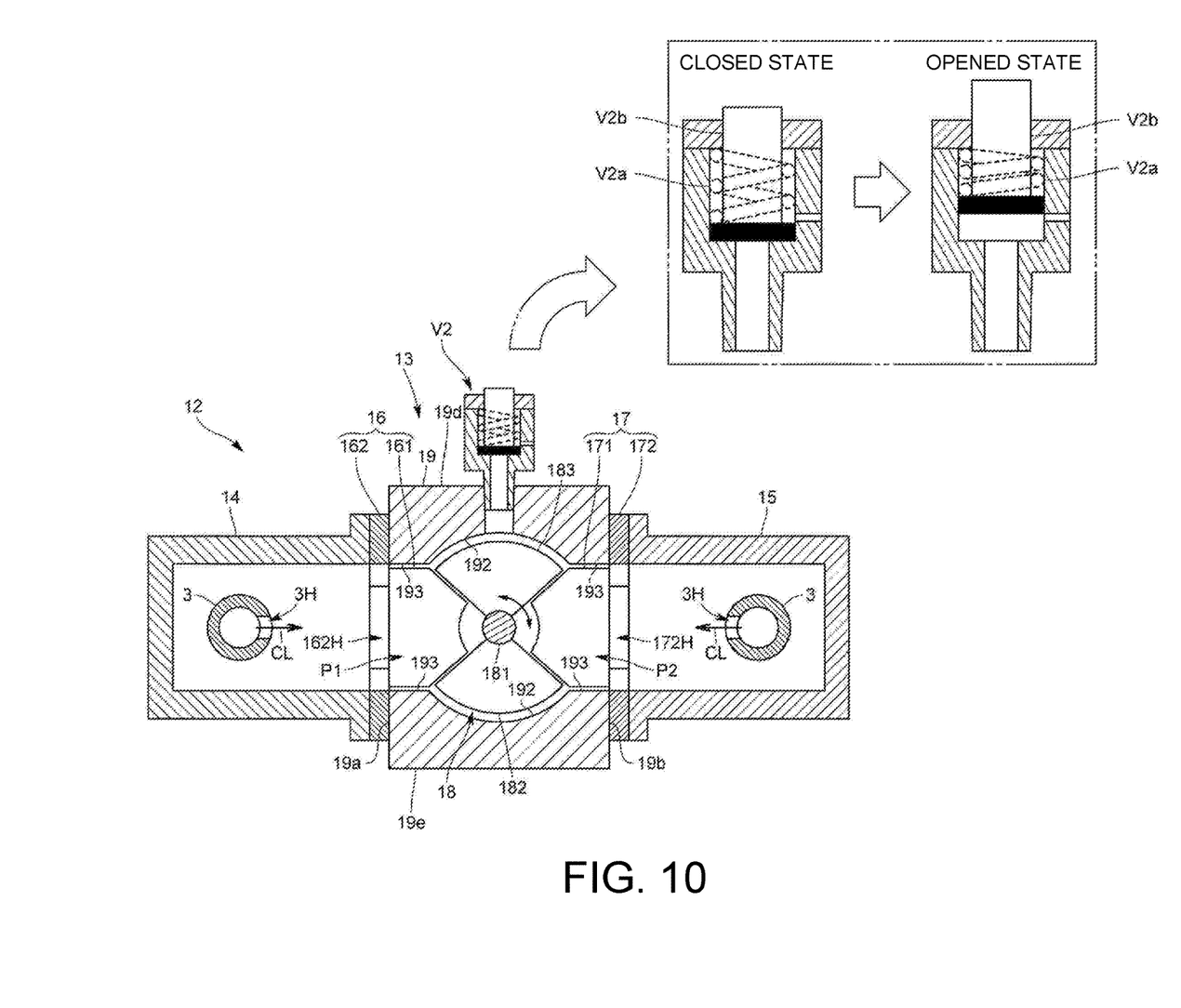
FIG. 10 is a longitudinal cross-sectional view schematically showing the variable capacitor of another embodiment.

As another example, as shown in FIG. 10, a configuration is exemplified in which a pressure reduction valve V2 is provided instead of the opening and closing valve V1 of FIG. 9.

Specifically, the pressure reduction valve V2 is an automatic pressure reduction valve which is configured to move a valve body V2b using an elastic force of a spring V2a and is switched from a closed state to an opened state when an internal pressure of the storage container 19 becomes a predetermined value or more.

In such a configuration, since the pressure reduction valve V2 is opened when the internal pressure of the storage container 19 becomes a predetermined value or more, for example, even when air bubbles are generated inside the storage container 19 while the flow of the cooling liquid is stopped, air bubbles can be automatically exhausted.

In addition, in the above-described embodiment, although the upper surface and the lower surface of the inner peripheral surface forming the through-hole 162H are formed in a comb tooth shape, the upper surface and the lower surface of the inner peripheral surface forming the inlet port P1 may be formed in a comb tooth shape without forming the inner peripheral surface forming the through-hole 162H in a comb tooth shape and the first fixed metal plate 161 may be inserted into the concave portion formed in the upper surface and the lower surface.

Further, the same applies to the through-hole 172H. The upper surface and the lower surface of the inner peripheral surface forming the outlet port P2 may be formed in a comb tooth shape without forming the inner peripheral surface forming the through-hole 172H in a comb tooth shape and the second fixed metal plate 171 may be inserted into the concave portion formed on the upper surface and the lower surface.

In the above-described embodiment, the movable electrode rotates around the rotation shaft, but the movable electrode may slide in one direction. Here, as a configuration in which the movable electrode slides, the movable electrode may slide in a direction orthogonal to a direction facing the fixed electrode so as to change a facing area or the movable electrode may slide in a direction facing the fixed electrode so as to change a facing distance.

Further, the shapes of the movable metal plate and the fixed metal plate are not limited to the above-described embodiment and may have various shapes.

Further, in the above-described embodiment, the variable capacitor is provided between the adjacent antenna conductors, but may be provided between the antenna conductor and the ground. In this case, the first fixed electrode is electrically connected to the antenna conductor and the second fixed electrode is grounded.

Further, in the above-described embodiment, the antenna conductor is formed in a straight shape, but may have a curved or bent shape. In this case, the metallic pipe may have a curved or bent shape or the insulation pipe may have a curved or bent shape.

Additionally, the technical spirit that the upper wall of the storage container is provided with the opening section for exhausting air bubbles in the storage container may be applied to an electrical element such as a battery or a fixed capacitor.

That is, such an electrical element is an electrical element including a storage container which is provided with an inlet port for introducing a liquid serving as an internal liquid and an outlet port for discharging the liquid and is filled with the liquid and at least a pair of electrodes which are provided inside the storage container and face each other and an upper wall of the storage container is provided with an opening section exhausting air bubbles in the storage container.

In addition, it goes without saying that the present invention is not limited to the above-described embodiment and various modifications can be made without departing from the spirit of the present invention.

The invention claimed is:

1. A capacitive element comprising:
a storage container which is provided with an inlet port for introducing a liquid serving as a dielectric and an outlet port for discharging the liquid and is filled with the liquid; and
at least a pair of electrodes which are provided inside the storage container and face each other,
wherein one of the pair of electrodes is a fixed electrode, the other of the pair of electrodes is a movable electrode movable with respect to the fixed electrode, and its capacitance is variable, and
wherein an upper wall of the storage container is provided with an opening section exhausting air bubbles in the storage container.

2. The capacitive element according to claim 1,
wherein the opening section is formed inside an outer peripheral portion of the upper wall, and
wherein an inner surface of the upper wall is provided with a bubble guide portion which is inclined upward as it goes from the outer peripheral portion of the upper wall toward the opening section and guides air bubbles to the opening section.

3. The capacitive element according to claim 2,
wherein the bubble guide portion is a flat surface or a curved surface.

4. The capacitive element according to claim 2,
wherein the inlet port is formed in a side wall of the storage container,
wherein the one of the pair of electrodes includes a flange member that is fixed to the side wall and is provided with a through-hole communicating with the inlet port and an electrode plate which is supported by the flange member, and
wherein the inlet port and at least a part of the through-hole communicate with each other without a step.

5. The capacitive element according to claim 1,
wherein a pipe member is connected to the opening section and the pipe member is connected to a downstream side of the storage container.

6. The capacitive element according to claim 1,
wherein a valve is provided in the opening section or a flow path connecting the opening section and a downstream side of the storage container.

7. A plasma processing device comprising:
the capacitive element according to claim 1; and
an antenna conductor which is electrically connected to the capacitive element and through which a high-frequency current flows to generate plasma.

8. The plasma processing device according to claim 7,
wherein the antenna conductor includes a flow path through which a cooling liquid flows, and
wherein the liquid serving as the dielectric of the capacitive element is formed by at least the cooling liquid.

* * * * *